United States Patent
Nowak et al.

(10) Patent No.: US 11,990,902 B2
(45) Date of Patent: May 21, 2024

(54) OPEN-DRAIN BUS REPEATER AND SYSTEM COMPRISING THE SAME

(71) Applicant: NEXPERIA B.V., Nijmegen (NL)

(72) Inventors: Katarzyna Nowak, Nijmegen (NL); Geethanadh Asam, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 17/828,552

(22) Filed: May 31, 2022

(65) Prior Publication Data
US 2022/0385290 A1 Dec. 1, 2022

(30) Foreign Application Priority Data

Jun. 1, 2021 (EP) ..................................... 21177187

(51) Int. Cl.
- *H03K 19/003* (2006.01)
- *G06F 13/40* (2006.01)
- *H03K 19/00* (2006.01)
- *H03K 19/017* (2006.01)
- *H03K 19/17784* (2020.01)

(52) U.S. Cl.
CPC ..... *H03K 19/0027* (2013.01); *G06F 13/4068* (2013.01); *H03K 19/01742* (2013.01); *H03K 19/17784* (2013.01)

(58) Field of Classification Search
CPC ............ G06F 13/4068; H03K 19/0027; H03K 19/01742; H03K 19/017784
See application file for complete search history.

(56) References Cited

U.S. PATENT DOCUMENTS

| | | | |
|---|---|---|---|
| 4,982,115 A | * | 1/1991 | Lee ........................ H03K 5/026 326/86 |
| 5,877,633 A | | 3/1999 | Ng et al. |
| 9,710,411 B2 | * | 7/2017 | Maung .................. G06F 13/385 |
| 10,181,852 B1 | * | 1/2019 | Tiwari ............. H03K 19/00361 |
| 10,566,975 B1 | * | 2/2020 | Tiwari ................ G06F 13/4004 |

(Continued)

OTHER PUBLICATIONS

Texas Instruments, Feb. 2021, TCA9416 Ultra-Low-Voltage I2C Translator, Texas Instruments, all pages.*

(Continued)

*Primary Examiner* — Kurtis R Bahr
(74) *Attorney, Agent, or Firm* — Ruggiero McAllister & McMahon LLC

(57) ABSTRACT

A repeater for open-drain bus communication and a system including the same is provided. The repeater includes at least one repeating unit having an A-side terminal connected to an A-side open-drain bus, and a B-side terminal electrically connected to a B-side open-drain bus. The repeater has a first mode to receive a signal at the A-side and to produce a signal at the B-side. The repeating unit includes a B-side accelerator element connected to the B-side terminal. The repeating unit when in a first mode includes a first control unit to, control the B-side accelerator element to pull up a voltage at the B-side when the voltage at the A-side surpasses a first threshold voltage during a rising edge of the voltage, and to subsequently control the B-side accelerator element to stop pulling up the voltage at the B-side when the voltage at the B-side surpasses a second threshold voltage.

18 Claims, 6 Drawing Sheets

(56) References Cited

U.S. PATENT DOCUMENTS 11,711,079 B2\* 7/2023 Shay .................. H04L 25/0288
                                                        326/86
2022/0278684 A1\* 9/2022 Shay .................. H03K 19/017

OTHER PUBLICATIONS

Texas Instruments TCA9416 Ultra-Low-Voltage I2C Translator dated Feb. 2021 (Year: 2021).\*
Extended European Search Report and Written Opinion for corresponding European application EP21177187.8, 8 pages dated Nov. 27, 2021.

\* cited by examiner

OPEN-DRAIN BUS REPEATER AND SYSTEM COMPRISING THE SAME

CROSS REFERENCE TO RELATED APPLICATION

This application claims the benefit under 35 U.S.C. § 119(a) of European Application No. 21177187.8 filed Jun. 1, 2021, the contents of which are incorporated by reference herein in their entirety.

BACKGROUND OF THE DISCLOSURE

1. Field of the Disclosure

The present disclosure generally relates to a repeater for open-drain bus communication and a system comprising the same. More particularly, the present disclosure relates to a repeater that is suitable for I2C bus communication.

2. Description of the Related Art

Hereinafter, an open-drain bus refers to a bus to which devices are connected using open-drain output drivers.

Data communication between devices in a system may be performed using a bus connection. For example, a device may communicate with another device using an open-drain bus connection based on the inter-integrated circuit (I2C) communication protocol.

FIG. 1 illustrates a known system 100, comprising a first communication unit 110 and a second communication unit 120 that are connected using a bus connection 101. Bus connection 101 comprises a first segment 102 comprising a first bus line 102a, and a second segment 103 comprising a second bus line 103a that are connected using an I2C bus repeater 130. First bus line 102a and second bus line 103a each have a parasitic capacitance associated therewith, denoted by C1 and C2, respectively. It should be noted that, typically, first segment 102 and second segment 103 each comprise a plurality of bus lines, e.g. a data bus line and a clock bus line.

First segment 102 further comprises a first pull-up resistor R1 connected in between first bus line 102a and a supply voltage Vcc. Similarly, second segment 103 further comprises a second pull-up resistor R2 connected in between second bus line 103a and supply voltage Vcc.

First communication unit 110 comprises a first I2C controller 111 that controls a first pull-down transistor 112 connected in between first bus line 102a and ground. Similarly, second communication unit 120 comprises a second controller 121 that controls a second pull-down transistor 122 connected in between second bus line 103a and ground.

For each pair of bus lines 102a, 103a, bus repeater 130 comprises a repeating unit 140. Repeating unit 140 has an A-side terminal 141a and a B-side terminal 141b. Each repeating unit 140 further comprises an A-to-B buffer 142a having its input connected to A-side terminal 141a and its output connected to a controlling input of a B-side pull-down transistor 140b, which transistor is arranged in between B-side terminal 141b and ground. Repeating unit 140 further comprises a B-to-A buffer 142b having its input connected to B-side terminal 141b and its output connected to a controlling input of an A-side pull-down transistor 143a, which transistor is arranged in between A-side terminal 141a and ground.

Each repeating unit 140 is configured to be operable in a first mode, in which repeating unit 140 receives a signal at A-side terminal 141a and produces a signal at B-side terminal 141b based on the signal received at A-side terminal 141a. However, repeating unit 140 may be bi-directional, as shown in FIG. 1. In that case, repeating unit may also be configured to be operable in a second mode, in which repeating unit 140 receives a signal at B-side terminal 141b and produces a signal at A-side terminal 141a based on the signal received at B-side terminal 141b.

Hereinafter, a statement referring to pulling up a voltage and a statement referring to pulling up a node at which this voltage is provided are assumed identical.

Bus connection 101 is an open-drain type bus, having a high idle state. In particular, in absence of pull-down by first pull-down transistor 112 and A-side pull-down transistor 143a, a voltage on first bus line 102a is pulled up by first pull-up resistor R1. More in particular, a current through pull-up resistor R1 charges capacitance C1 until the voltage on first bus line 102a is pulled up to supply voltage Vcc, which voltage corresponds to a logic 'high' voltage (VH). Similarly, in absence of pull-down by second pull-down transistor 122 and B-side pull-down transistor 140b, a voltage on second bus line 103a is pulled up to supply voltage Vcc by second pull-up resistor R2.

First communication unit 110 can transfer data to second communication unit 120 over bus connection 101 by changing the voltage on first bus line 102a. In particular, if a logic 'low' voltage (VL) signal is to be transmitted over bus connection 101, then first communication unit 110 controls first pull-down transistor 112, using first I2C controller 111, to pull down the voltage on first bus line 102a. On the other hand, if a VH signal is to be transmitted, then first I2C controller 111 deactivates first pull-down transistor 112 to allow the voltage on first bus line 102a to be pulled up by first pull-up resistor R1.

If first communication unit 110 is transferring data to second communication unit 120, then repeating unit 140 operates in the first mode. The voltage on first bus line 102a is received by repeating unit 140 at A-side terminal 141a. A-to-B buffer 142a controls B-side pull-down transistor 143b based on the voltage at A-side terminal 141a to reproduce the signal received at A-side terminal 141a. In particular, if a VL signal is received at A-side terminal 141a, then A-to-B buffer 142a activates B-side pull-down transistor 143b such that the voltage at B-side terminal 141b, and therefore the voltage on second bus line 103a, is pulled down. On the other hand, if a VH signal is received at A-side terminal 141a, then A-to-B buffer 142a deactivates B-side pull-down transistor 143b to allow the voltage at B-side terminal 141b, and therefore the voltage on second bus line 103a, to be pulled up by second pull-up resistor R2.

The operation of system 100 is bi-directional. More in particular, data communication is also possible from second communication unit 120 to first communication unit 110 in a manner similar to that described above. In that case, repeating unit 140 operates in the second mode.

The time required for the voltage on a bus line to change from VL to VH (i.e., 'rise time') depends on a time constant formed by a capacitance of said bus line and the resistance of the corresponding pull-up resistor. Typically, a voltage transition from VL to VH will therefore occur in an exponentially rising manner.

To decrease the rise time for the voltage on second bus line 103a, repeating unit 140 of known system 100 comprises an accelerator element 144. This accelerator element comprises a current source connected to B-side terminal 141b. This current source provides an extra charge current thereby decreasing the time to charge the bus capacitance.

In open-drain bus communication systems, when operating in the first mode, second communication unit 120 may communicate to first communication unit 110 by means of pulling down the voltage on bus line 103A. The Applicant has found that designing detection circuitry for detecting such pulldown is complicated when using the known bus repeater and that the use of this bus repeater put constraints on the overall system implementation.

SUMMARY

It is an object of the present disclosure to provide a bus repeater for which the abovementioned problems do not occur or hardly so.

According to a first aspect of the present disclosure, the bus repeater comprises a repeating unit, the repeating unit having an A-side terminal configured to be electrically connected to an A-side open-drain bus line, and a B-side terminal configured to be electrically connected to a B-side open-drain bus line. The repeating unit is operable in a first mode in which the repeating unit is configured to receive a signal at the A-side terminal and to produce a signal at the B-side terminal based on the signal received at the A-side terminal. The repeating unit comprises a B-side accelerator element electrically connected to the B-side terminal.

The repeater according to the present disclosure is characterized in that the repeating unit further comprises a first control unit configured to, when the repeating unit is operating in the first mode, control the B-side accelerator element to pull up a voltage at the B-side terminal when the voltage at the A-side terminal surpasses a first threshold voltage during a rising edge of said voltage, and to subsequently control the B-side accelerator element to stop pulling up the voltage at the B-side terminal when the voltage at the B-side terminal surpasses a second threshold voltage.

The B-side accelerator element may comprise a B-side accelerator transistor arranged in between a B-side supply voltage terminal and the B-side terminal. The accelerator transistor has a control terminal. The first control unit can be configured to control a voltage at the control terminal of the B-side accelerator transistor to control the B-side accelerator transistor. For example, the B-side accelerator transistor may comprise a p-type metal-oxide-semiconductor, PMOS, transistor.

The repeating unit may further comprise an A-to-B buffer configured to receive the signal at the A-side terminal and to produce a first buffered signal, a B-side pull-down control unit configured to receive the first buffered signal from the A-to-B buffer and to produce a first control signal based on the received first buffered signal, the B-side pull-down control unit being configured to be activated in response to a high to low voltage transition at the A-side terminal when the repeating unit is operating in the first mode, and a B-side pull-down element configured to pull down the voltage at the B-side terminal based on said first control signal.

The B-side pull-down element may comprise a B-side pull-down transistor that is arranged in between the B-side terminal and a B-side ground reference terminal and that has a control terminal, wherein the first control signal controls a voltage at the control terminal of the B-side pull-down transistor to control the B-side pull-down transistor. For example, the B-side pull-down transistor may comprise an n-type metal oxide semiconductor, NMOS, transistor.

The repeating unit may further comprise an A-side accelerator element electrically connected to the A-side terminal, and a second control unit. When the repeating unit is operating in the first mode, the second control unit may be configured to control the A-side accelerator element to pull up the voltage at the A-side terminal when the voltage at the A-side terminal surpasses a third threshold voltage during a rising edge of said voltage, and to subsequently control the A-side accelerator element to stop pulling up the voltage at the A-side terminal when the voltage at the A-side terminal surpasses a fourth threshold voltage, the fourth threshold voltage being greater than the third threshold voltage.

The A-side accelerator element may comprise an A-side accelerator transistor that is arranged in between an A-side supply voltage terminal and the A-side terminal and that has a control terminal. The second control unit may be configured to control a voltage at the control terminal of the A-side accelerator transistor to control the A-side accelerator transistor. For example, the A-side accelerator transistor may comprise a PMOS transistor.

The first threshold voltage may be equal to the third threshold voltage. Additionally or alternatively, the second threshold voltage may be equal to the fourth threshold voltage.

The second control unit may be identical to the first control unit. Alternatively, the second control unit is formed by the first control unit.

The bus repeater according to the present disclosure may be bi-directional. To this end, the repeating unit may be operable in a second mode in which the repeating unit is configured to receive a signal at the B-side terminal and to produce a signal at the A-side terminal based on the signal received at the B-side terminal. When the repeating unit is operating in the second mode, the second control unit may be configured to control the A-side accelerator element to pull up a voltage at the A-side terminal when the voltage at the B-side terminal surpasses a fifth threshold voltage during a rising edge of said voltage, and to subsequently control the A-side accelerator element to stop pulling up the voltage at the A-side terminal when the voltage at the A-side terminal surpasses a sixth threshold voltage.

The repeating unit may further comprise a B-to-A buffer configured to receive the signal at the B-side terminal and to produce a second buffered signal, an A-side pull-down control unit configured to receive the second buffered signal from the B-to-A buffer and to produce a second control signal based on the received second buffered signal, the A-side pull-down control unit being configured to be activated in response to a high to low voltage transition at the B-side terminal when the repeating unit is operating in the second mode, and an A-side pull-down element configured to pull down the voltage at the A-side terminal based on said second control signal.

The A-side pull-down element may comprise an A-side pull-down transistor that is arranged in between the A-side terminal and an A-side ground reference terminal and that has a control terminal, wherein the second control signal controls a voltage at the control terminal of the A-side pull-down transistor to control the A-side pull-down transistor. For example, the A-side pull-down transistor may comprise an n-type metal oxide semiconductor, NMOS, transistor.

When the repeating unit is operating in the second mode, the first control unit may be configured to control the B-side accelerator element to pull up the voltage at the B-side terminal when the voltage at the B-side terminal surpasses a seventh threshold voltage, and to subsequently control the B-side accelerator element to stop pulling up the voltage at the B-side terminal when the voltage at the B-side terminal surpasses an eighth threshold voltage, the eighth threshold voltage being greater than the seventh threshold voltage.

The fifth and/or seventh threshold voltage may be equal to the first threshold voltage. Additionally or alternatively, the sixth and/or eighth threshold voltage may be equal to the second threshold voltage.

The repeating unit may further comprise a direction determination unit configured to determine whether the repeating unit is operating in the first mode or the second mode, and to control the A-side pull-down control unit and/or the B-side pull-down control unit based on the determined mode.

The direction determination unit may comprise an A-side direction determination element arranged in between the B-to-A buffer and the A-side pull-down control unit, and a B-side direction determination element arranged in between the A-to-B buffer and the B-side pull-down control unit. The A-side direction determination element may be configured to determine, based on the first buffered signal and the second buffered signal, whether the repeating unit is operating in the first mode, and to control the A-side pull-down control unit based on whether the repeating unit is operating in the first mode. Similarly, the B-side direction determination element may be configured to determine, based on the first buffered signal and the second buffered signal, whether the repeating unit is operating in the second mode, and to control the B-side pull-down control unit based on whether the repeating unit is operating in the second mode.

The A-side direction determination element may be configured to determine that the repeating unit is operating in the first mode when a high to low voltage transition of the first buffered signal occurs before a high to low transition of the second buffered signal. Similarly, the B-side direction determination element may be configured to determine that the repeating unit is operating in the second mode when a high to low voltage transition of the second buffered signal occurs before a high to low transition of the first buffered signal.

The repeating unit may further comprise an A-side pull-up resistor, a terminal thereof being electrically connected to the A-side terminal and another terminal thereof to an A-side supply voltage terminal. Additionally or alternatively, the repeating unit may further comprise a B-side pull-up resistor, a terminal thereof being electrically connected to the B-side terminal, and another terminal thereof to a B-side supply voltage terminal. However, the pull-up resistors or additional pull-up resistors may also be connected to respective bus lines externally to the repeater.

The A-side supply voltage may be substantially identical to the B-side supply voltage. Alternatively, the A-side supply voltage may differ from the B-side supply voltage, in which case the repeating unit may further comprise an A-to-B level shifter arranged in between the A-to-B buffer and the B-side direction determination element. The A-to-B level shifter may be configured to generate a signal at an output thereof based on the first buffered signal, said outputted signal having a different voltage range with respect to the first buffered signal. Similarly, the repeating unit may further comprise a B-to-A level shifter arranged in between the B-to-A buffer and the A-side direction determination element. The B-to-A level shifter may be configured to generate a signal at an output thereof based on the second buffered signal, said outputted signal having a different voltage range with respect to the second buffered signal. For example, the voltage range of the signal generated by the A-to-B level shifter may be equal to the voltage range of the second buffered signal, and the voltage range of the signal generated by the B-to-A level shifter may be equal to the voltage range of the first buffered signal.

The repeating unit may further comprise a first pull-down detection unit configured to determine whether an external device is pulling down the voltage at the A-side terminal during a low to high voltage transition at the A-side terminal. Additionally or alternatively, the repeating unit may further comprise a second pull-down detection unit configured to determine whether an external device is pulling down the voltage at the B-side terminal during a low to high voltage transition at the B-side terminal. For example, the first pull-down detection unit may be used to detect an acknowledgement signal from an external device at the A-side terminal. The first and second pull-down detection unit may be formed using a single combined detection units, or as separate detection units.

The first pull-down detection unit and the second pull-down detection unit may be configured to compare one or more parameters of said low to high voltage transition at the A-side terminal or the B-side terminal, respectively, to corresponding one or more pre-defined parameters, and to output a signal indicative of external pull-down based on said comparison.

The one or more parameters may represent a voltage difference between the voltage at a respective terminal among the A-side and B-side terminal at a start and at an end of a predetermined time interval. Additionally or alternatively, the one or more parameters may represent a voltage at a predetermined time after the voltage at a respective terminal among the A-side and B-side terminal starts being pulled up by a corresponding accelerator element. Additionally or alternatively, the one or more parameters may represent a plurality of voltages at a respective terminal among the A-side and B-side terminal at different time instances. The one or more pre-defined parameters may be predefined parameters corresponding to an expected or preferred low to high transition at said terminal, enabling a comparison between an expected transition and a measured or determined transition.

The first pull-down detection unit and/or the second pull-down detection unit may be configured to initiate a first timer when the voltage at a respective terminal among the A-side or B-side terminal starts being pulled up by the corresponding accelerator element, and to output a signal indicative of external pull-down if the first timer exceeds a first time-out value before the voltage at said respective terminal reaches a first pre-defined voltage level.

The first pull-down detection unit and/or the second pull-down detection unit may be further configured to, if the first timer does not exceed the first time-out value before the voltage at said respective terminal reaches the first pre-defined voltage level, initiate a second timer when the voltage at said respective terminal surpasses the first pre-defined voltage level, and output a signal indicative of external pull-down if the second timer exceeds a second time-out value before the voltage at said respective terminal reaches a second pre-defined voltage level.

The first timer and the second timer may be identical, or the second timer is formed by the first timer.

In communication systems, such as for I2C communication, the first communication unit may provide a clock signal to the second communication unit via a repeating unit of the bus repeater, in order for the second communication unit to synchronize a data signal received via another bus line to the received clock signal. However, it may occur that the second communication unit requires more time to process the received data before proceeding, and may indicate so through a pull-down event on the clock bus line to which it is connected. In the I2C protocol, this specific pull-down event is referred to as 'clock stretching'.

In a particular scenario, the second communication unit performs a pull-down event while the voltage at the B-side terminal is at a logic low. In this case, the pull-down strength at the B-side terminal is effectively increased, resulting in a decrease of the voltage at the B-side terminal to a value below the logic low. The Applicant has found that detection of an external pull-down in this scenario is difficult to achieve with currently known bus repeaters. Furthermore, detecting an external pull-down at a particular terminal of the repeating unit may be difficult when a low supply voltage is used for said terminal, in which case the difference between the voltage at said terminal during external pull-down and the voltage corresponding to a logic low can be relatively small.

According to a second aspect of the present disclosure, the bus repeater comprises a repeating unit, the repeating unit having an A-side terminal configured to be electrically connected to an A-side open-drain bus line, and a B-side terminal configured to be electrically connected to a B-side open-drain bus line. The repeating unit is operable in a first mode in which the repeating unit is configured to receive a signal at the A-side terminal and to produce a signal at the B-side terminal based on the signal received at the A-side terminal.

The repeating unit further comprises an A-to-B buffer configured to receive the signal at the A-side terminal and to produce a first buffered signal, a B-side pull-down control unit configured to receive the first buffered signal from the A-to-B buffer and to produce a first control signal based on the received first buffered signal, the B-side pull-down control unit being configured to be activated in response to a high to low voltage transition at the A-side terminal when the repeating unit is operating in the first mode, and a B-side pull-down element configured to pull down the voltage at the B-side terminal based on said first control signal.

The B-side pull-down element comprises a B-side pull-down transistor that is arranged in between the B-side terminal and a B-side ground reference terminal and that has a control terminal, wherein the first control signal controls a voltage at the control terminal of the B-side pull-down transistor to control the B-side pull-down transistor. For example, the B-side pull-down transistor may comprise an n-type metal oxide semiconductor, NMOS, transistor.

The B-side pull-down control unit comprises a B-side comparing unit configured to compare the voltage at the B-side terminal to a first reference voltage, and to generate the first control signal based on a result of said comparison.

The B-side pull-down control unit may further comprise a B-side pull-down detection unit configured to detect a pull-down event by an external device that is connected to the B-side terminal via the B-side open-drain bus line by detecting that the voltage at the B-side terminal is less than the first reference voltage minus a first predefined voltage, and to output a result of the detection at an output thereof. The first reference voltage may correspond to a logic low voltage for the B-side open-drain bus line.

The B-side pull-down detection unit may be configured to generate a first current based on the voltage at the B-side terminal, generate a first reference current based on the first reference voltage, generate a first intermediate current based on the first current, and compare the first intermediate current to the first reference current.

The B-side pull-down detection unit may comprise a first detection unit transistor, a second detection unit transistor, and a first current mirror, an input branch thereof being electrically connected to the first detection unit transistor, and an output branch thereof being electrically connected to the second detection unit transistor. The first current may be generated by applying the voltage at the B-side terminal to a gate or base terminal of the first detection unit transistor. The first reference current may be generated by applying the first reference voltage to a gate or base terminal of the second detection unit transistor. The first intermediate current may be generated at the output branch of the first current mirror based on the first current received at the input branch of the first current mirror. The first reference current and the first intermediate current may depend on a voltage at a first node to which the second detection unit transistor and the output branch of the first current mirror are connected, and the B-side pull-down detection unit may be configured to detect the pull-down event based on the voltage at said first node.

The first and second detection unit transistor may each comprise an NMOS transistor, and the first current mirror may be realized using p-type metal-oxide-semiconductor, PMOS, transistors.

The B-side pull-down detection unit may further comprise a first inverter connected in between the first node and the output of the B-side pull-down detection unit. In that case, a voltage signal at the output of the B-side pull-down detection unit may represent the result of the detection of the pull-down event at the B-side terminal.

The repeater may be bidirectional. To this end, the repeating unit may be operable in a second mode in which the repeating unit is configured to receive a signal at the B-side terminal and to produce a signal at the A-side terminal based on the signal received at the B-side terminal.

The repeating unit may further comprise a B-to-A buffer configured to receive the signal at the B-side terminal and to produce a second buffered signal, an A-side pull-down control unit configured to receive the second buffered signal from the B-to-A buffer and to produce a second control signal based on the received second buffered signal, the A-side pull-down control unit being configured to be activated in response to a high to low voltage transition at the B-side terminal when the repeating unit is operating in the second mode, and an A-side pull-down element configured to pull down the voltage at the A-side terminal based on said second control signal. The A-side pull-down element comprises an A-side pull-down transistor that is arranged in between the A-side terminal and an A-side ground reference terminal and that has a control terminal, wherein the second control signal controls a voltage at the control terminal of the A-side pull-down transistor to control the A-side pull-down transistor, wherein the A-side pull-down transistor preferably comprises an NMOS transistor.

The A-side pull-down control unit may comprise an A-side comparing unit configured to compare a voltage at the A-side terminal to a second reference voltage, and to generate the second control signal based on a result of said comparison. For example, the second reference voltage may correspond to a logic low for the A-side open-drain bus.

The A-side pull-down control unit may further comprise an A-side pull-down detection unit configured to detect a pull-down event by an external device that is connected to the A-side terminal via the A-side open-drain bus by detecting that the voltage at the A-side terminal is less than the second reference voltage minus a second predefined voltage, and output a result of the detection at an output thereof.

The A-side pull-down detection unit may be configured to generate a second current based on the voltage at the A-side terminal, generate a second reference current based on the second reference voltage, generate a second intermediate current based on the second current, and compare the second intermediate current to the second reference current.

The A-side pull-down detection unit comprises a third detection unit transistor, a fourth detection unit transistor, and a second current mirror, an input branch thereof being electrically connected to the third detection unit transistor, and an output branch thereof being electrically connected to the fourth detection unit transistor. The second current may be generated by applying the voltage at the A-side terminal to a gate or base terminal of the third detection unit transistor. The second reference current may be generated by applying the second reference voltage to a gate or base terminal of the fourth detection unit transistor. Furthermore, the second intermediate current may be generated at the output branch of the second current mirror based on the second current received at the input branch of the current mirror. Furthermore, the second reference current and the second intermediate current may depend on a voltage at a second node to which the fourth detection unit transistor and the output branch of the second current mirror are connected. The A-side pull-down detection unit may be configured to detect the pull-down event based on the voltage at said second node.

The third and fourth detection unit transistor may each comprise an NMOS transistor, and the second current mirror may be realized using PMOS transistors.

The A-side pull-down detection unit may further comprise a second inverter connected in between the second node and the output of the A-side pull-down detection unit. A voltage signal at the output terminal of the A-side pull-down detection unit may represent the result of the detection of the pull-down event at the A-side terminal.

Here, it is noted that the embodiments in accordance with the second aspect of the present disclosure, as described above, can be used independently from the preceding embodiments in accordance with the first aspect of the present disclosure. However, they can also be used concurrently. That is, the features presented in the embodiments in accordance with the second aspect of the present disclosure may similarly be applicable to embodiments in accordance with the first aspect of the present disclosure.

The bus repeater according to the first and/or second aspect of the present disclosure may be an inter-integrated circuit (I2C) bus repeater. The bus repeater may comprise a plurality of said repeating units.

According to yet another aspect of the present disclosure, a system is provided comprising one or more first bus lines, one or more second bus lines, a first communication unit, a second communication unit, and the bus repeater described above having a plurality of repeating units. The A-side terminal of at least one repeating unit thereof is electrically connected to the first communication unit via a respective first bus line, and the B-side terminal of said at least one repeating unit thereof is electrically connected to the second communication unit via a respective second bus line.

The bus repeater may be an inter-integrated circuit (I2C) bus repeater. The at least one repeating unit may comprise a first repeating unit, the A-side terminal thereof being electrically connected to a data pin of the first communication unit via a respective first bus line, and the B-side terminal thereof being electrically connected to a data pin of the second communication unit via a respective second bus line. The at least one repeating unit may further comprise a second repeating unit, the A-side terminal thereof being electrically connected to a clock pin of the first communication unit via a respective first bus line, and the B-side terminal thereof being electrically connected to a clock pin of the second communication unit via a respective second bus line.

BRIEF DESCRIPTION OF THE DRAWINGS

Next, the present disclosure will be described in detail with reference to the appended drawings, wherein.

Hereinafter, reference will be made to the appended drawings. It should be noted that identical reference signs may be used to refer to identical or similar components.

DETAILED DESCRIPTION

Figure 1:
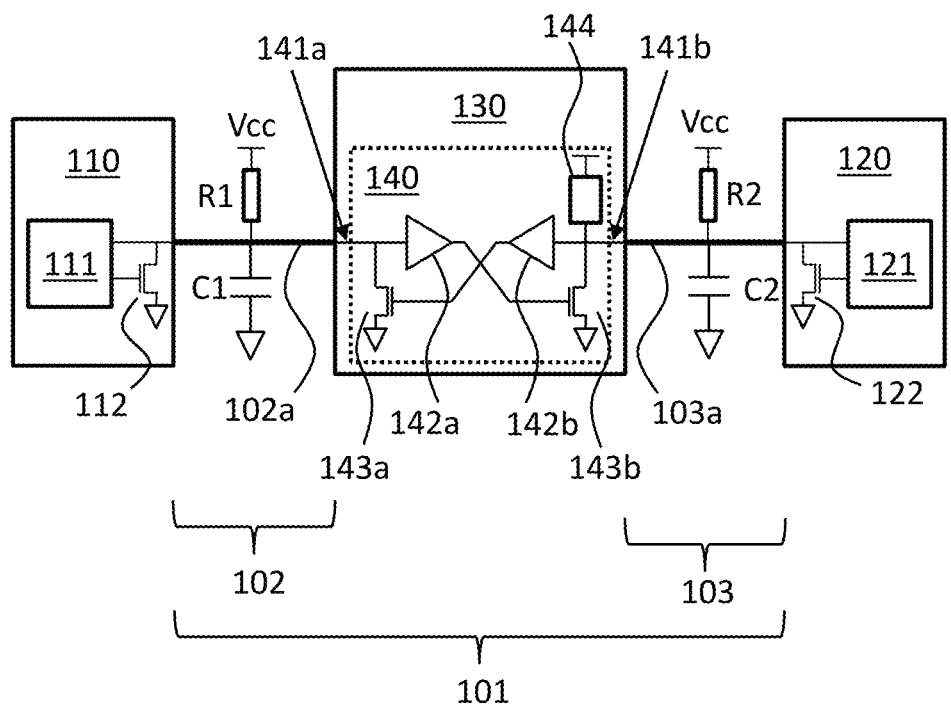
FIG. 1 is a schematic diagram of an open-drain communication system known in the art.
Figure 2:
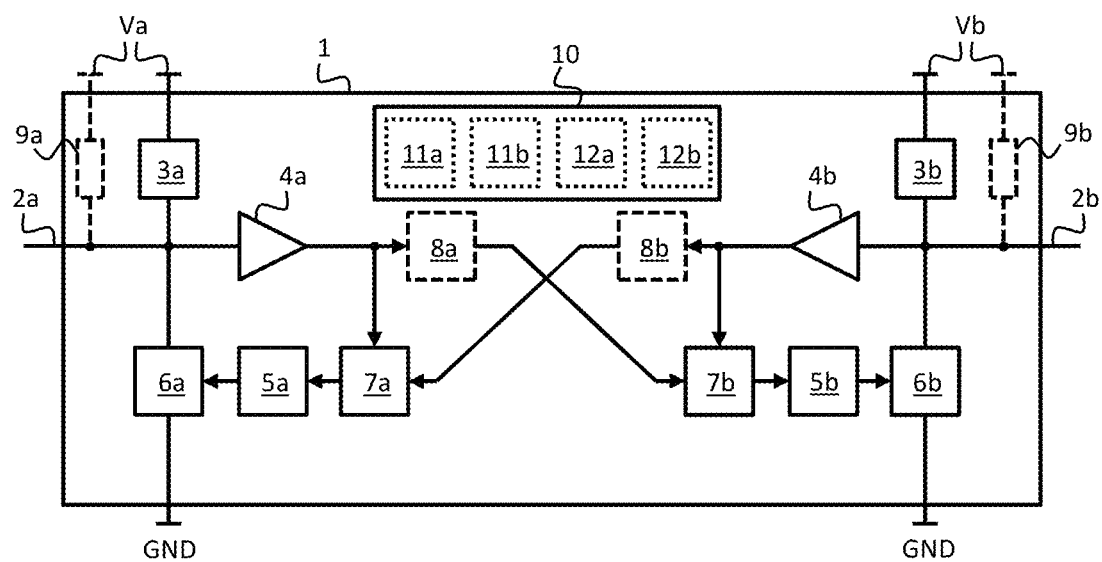
FIG. 2 is a schematic diagram of a repeating unit of a repeater according to an embodiment of the present disclosure.

In FIG. 2, a repeating unit 1 of a repeater for open-drain bus communication according to the present disclosure is shown. The repeater may comprise at least one repeating unit 1 as shown in FIG. 2.

Repeating unit 1 comprises an A-side terminal 2a and a B-side terminal 2b. A-side terminal 2a is configured to be electrically connected to a first communication unit using a first bus line (e.g., an A-side open-drain bus). Similarly, B-side terminal 2b is configured to be electrically connected to a second communication unit using a second bus line (e.g., a B-side open-drain bus). The first communication unit can communicate with the second communication unit via the bus connection formed by the first bus line, repeating unit 1 and the second bus line. In particular, the first communication unit can transfer data to the second communication unit by providing a voltage signal, such as a logic 'high' voltage signal (VH) or a logic 'low' voltage signal (VL), to A-side terminal 2a of repeating unit 1 via the first bus line. This voltage signal is then repeated at B-side terminal 2b by repeating unit 1. Then, the second communication unit can receive the voltage signal provided by the first communication unit from B-side terminal 2b of repeating unit 1 via the second bus line.

Repeating unit 1 comprises an A-to-B buffer 4a, a B-side pull-down control unit 5b, and a B-side pull-down element 6b arranged between B-side terminal 2b and the B-side ground reference terminal. A-to-B buffer 4a receives the voltage signal at A-side terminal 2a, and generates a first buffered voltage signal. The first buffered voltage signal may then be provided to B-side pull-down control unit 5b. However, in some embodiments, the first buffered voltage signal is instead provided to a direction detection unit, as will be described further below.

B-side pull-down control unit 5b is configured to control B-side pull-down element 6b based on the received buffered signal. For example, if the received buffered voltage signal is indicative of a VH signal received at A-side terminal 2*a*, then B-side pull-down control unit 5*b* does not activate B-side pull-down element 6*b*, such that a voltage at B-side terminal 2*b* is pulled up to or remains at VH. On the other hand, if the received buffered voltage signal is indicative of a VL signal at A-side terminal 2*a*, then B-side pull-down control unit 5*b* generates a first control signal to control B-side pull-down element 6*b* to pull down the voltage at B-side terminal 2*b*. For example, B-side pull-down element 6*b* is a pull-down transistor that is configured to pull down the voltage at B-side terminal 2*b* by sinking a charge of the B-side bus line capacitance based on its gate or base voltage. The gate or base voltage is controlled by the first control signal generated by B-side pull-down control unit 5*b*. B-side pull-down element 6*b* is, for example, an n-type metal-oxide-semiconductor (NMOS) transistor.

In absence of pull-down, the voltage at B-side terminal 2*b* is pulled up to a B-side supply voltage Vb by a pull-up resistor, such as a B-side pull-up resistor 9*b* and/or another pull-up resistor connected to the second bus line externally to repeating unit 1. On the other hand, if the voltage at, for example, A-side terminal 2*a* is pulled down by the first communication unit, then, in order to repeat said signal at B-side terminal 2*b*, B-side pull-down element 6*b* is controlled by B-side pull-down control unit 5*b* to pull down the voltage at B-side terminal 2*b* to VL.

For example, B-side pull-down element 6*b* may be connected to a B-side reference voltage, such as ground, and may thus pull down the voltage at B-side terminal 2*b* towards said B-side reference voltage. However, since the (external) pull-up resistor continuously pulls up the voltage at B-side terminal 2*b*, VL may be greater than said B-side reference voltage. In other words, the logic 'low' voltage level VL depends on a pull-down strength of B-side pull-down element 6*b*, and a pull-up strength of the (external) pull-up resistor. The pull-down strength of B-side pull-down element 6*b* is controlled by B-side pull-down control unit 5*b* using the first control signal.

During a transition from VL to VH at B-side terminal 2*b*, the voltage at B-side terminal 2*b* will increase in an exponentially rising manner based on a time constant of the capacitance of the second bus line in combination with the resistance of the corresponding pull-up resistor. In particular, a current through the pull-up resistor, which current charges the capacitor, will decrease as the voltage at B-side terminal 2*b* increases. In other words, the rise time at B-side terminal 2*b*, and therefore also the maximum reliable communication rate, is generally dictated by said time constant.

The rise time can be improved by decreasing the resistance of the pull-up resistor. However, this will inherently require B-side pull-down element 6*b* to have a greater pull-down strength if the same VL level is desired, resulting in an increase in power consumption of repeating unit 1. Consequently, there is a trade-off between the maximum communication rate and the power consumption of the repeater.

To further improve the rise and fall time performance independently of the selected pull-up resistance, repeating unit 1 further comprises a B-side accelerator element 3*b* electrically connected to B-side terminal 2*b*, and a first control unit 11*a* configured to control said B-side accelerator element 3*b* to pull up the voltage at B-side terminal 2*b*. For example, when repeating unit 1 operates in the first mode, first control unit 11*a* determines whether a transition from VL to VH occurs at A-side terminal 2*a*, and activates B-side accelerator element 3*b* during at least a portion of the transition from VL to VH at B-side terminal 2*b*. A more detailed operation of B-side accelerator element 3*b* is described further below with reference to FIG. 3.

Repeating unit 1 as shown in FIG. 2 is bidirectional. That is, repeating unit 1 may be operable in a second mode in which repeating unit 1 receives a voltage signal at B-side terminal 2*b* and repeats said voltage signal at A-side terminal 2*a*. To this end, repeating unit 1 comprises a B-to-A buffer 4*b*, a A-side pull-down control unit 5*a*, and a A-side pull-down element 6*a* arranged sequentially between B-side terminal 2*b* and A-side terminal 2*a*. An operation of B-to-A buffer 4*b*, A-side pull-down control unit 5*a* and A-side pull-down element 6*a* may be similar or identical to the operation of A-to-B buffer 4*a*, B-side pull-down control unit 5*b* and B-side pull-down element 6*b*. Therefore, a detailed description thereof is omitted.

Furthermore, repeating unit 1 may comprise an A-side pull-up resistor 9*a* connected between an A-side supply voltage Va and A-side terminal 2*a*. Additionally or alternatively, an external pull-up resistor may be connected to first bus line. The voltage at A-side terminal 2*a* is pulled up by said pull-up resistor.

Repeating unit 1 further comprises a direction determination unit configured to determine whether repeating unit 1 is operating in the first mode or the second mode, and to control A-side pull-down control unit 5*a* and/or B-side pull-down control unit 5*b* accordingly.

For example, as shown in FIG. 2, repeating unit 1 comprises an A-side direction determination element 7*a* and a B-side direction determination element 7*b*. A-side direction determination element 7*a* receives the first buffered signal from A-to-B buffer 4*a* and the second buffered signal from B-to-A buffer 4*b*, and determines based on said buffered signals whether repeating unit 1 is operating in the second mode. Similarly, B-side direction determination element 7*b* receives the first buffered signal from A-to-B buffer 4*a* and second buffered signal from B-to-A buffer 4*b*, and determines based on said buffered signals whether repeating unit 1 is operating in the first mode.

For example, if a voltage transition occurs at A-side terminal 2*a*, then B-side direction determination element 7*b* can determine, based on the first buffered signal, that repeating unit 1 is operating in the first mode. Accordingly, B-side direction determination element 7*b* enables B-side pull-down control unit 5*b*. Furthermore, A-side direction determination element 7*a* disables A-side pull-down control unit 5*a*, because the voltage at A-side terminal 2*a* should be controlled by the first communication unit rather than by repeating unit 1. In other words, in the first mode, A-side pull-down control unit 5*a* and A-side pull-down element 6*a* are disabled, and, in the second mode, B-side pull-down control unit 5*b* and B-side pull-down element 6*b* are disabled.

First and second supply voltage Va, Vb may be an identical DC voltage, or may be different DC voltages. The latter may be required when the first communication unit operates based on a different voltage range compared to the second communication unit. For example, the first communication unit may require a VL level of 0.1 V and a VH level of 1 V, while the second communication unit may require a VL level of 0.3 V and a VH level of 3.3 V. In that case, for example, a VH signal provided by the first communication unit may not be recognized as a VH signal by the first communication unit. To remedy this, A-side terminal 2*a* may have an A-side logic 'high' voltage level VHa based on supply voltage Va, and B-side terminal 2*b* may have a B-side logic 'high' voltage level VHb based on supply voltage Vb. A logic 'low' voltage level VLa, VLb at A-side and B-side terminal 2a, 2b, respectively, may depend on the pull-up strength of the corresponding pull-up resistor and the pull-down strength of the corresponding pull-down element.

Repeating unit 1 may further comprise an A-to-B level shifter 8a and a B-to-A level shifter 8b if first supply voltage Va differs from second supply voltage Vb. A-to-B level shifter 8a receives a first buffered signal from A-to-B buffer 4a and outputs a voltage signal having a different voltage range with respect to the received first buffered signal. Similarly, B-to-A level shifter 8b receives a second buffered signal from B-to-A buffer 4b and outputs a signal having a different voltage range with respect to the received second buffered signal.

For example, the first buffered signal is a voltage signal between the A-side ground reference voltage received at the A-side ground reference terminal and A-side supply voltage Va, and the voltage signal outputted by A-to-B level shifter 8a is a voltage between the B-side ground reference voltage received at the B-side ground reference terminal and B-side supply voltage Vb. Similarly, the second buffered signal may be a voltage signal between the B-side ground reference voltage received at the B-side ground reference terminal and B-side supply voltage Vb, and the voltage signal outputted by B-to-A level shifter 8b may be a voltage between the A-side ground reference voltage received at the A-side ground reference terminal and A-side supply voltage Va. Accordingly, A-side direction detection element 7a can compare the first buffered signal to the signal outputted by B-to-A level shifter 8b, which signals have a same voltage range. Similarly, second direction detection element 7b can compare the second buffered signal to the signal outputted by A-to-B level shifter 8a, which signals also have a same voltage range.

Repeating unit 1 according to FIG. 2 further comprises an A-side accelerator element 3a electrically connected to A-side terminal 2a, and a second control unit 11b configured to control said A-side accelerator element 3a to pull up the voltage at A-side terminal 2a. A-side accelerator element 3a may be identical or similar to B-side accelerator element 3b, and second control unit 11b may be identical or similar to first control unit 11a.

A-side and B-side accelerator element 3a, 3b may each comprise a voltage-controlled current source. For example, B-side accelerator element 3b may comprise a p-type MOS (PMOS) transistor connected between second supply voltage Vb and B-side terminal 2b, and first control unit 11a may control a gate voltage thereof. Similarly, A-side accelerator element 3a may comprise a PMOS transistor connected between first supply voltage Va and A-side terminal 2a, and second control unit 11b may control a gate voltage thereof. As a result, each of A-side accelerator element 3a and B-side accelerator element 3b may, upon being activated, generate a substantially constant current for charging the bus line capacitance while operating in saturation.

Furthermore, the current generated by A-side and B-side accelerator element 3a, 3b may substantially exceed the current through the pull-up resistors connected to the same bus line, particularly as the voltage on said bus line increases. As a result, the rise time at A-side terminal 2a and/or B-side terminal 2b can be reduced significantly.

Figure 3:
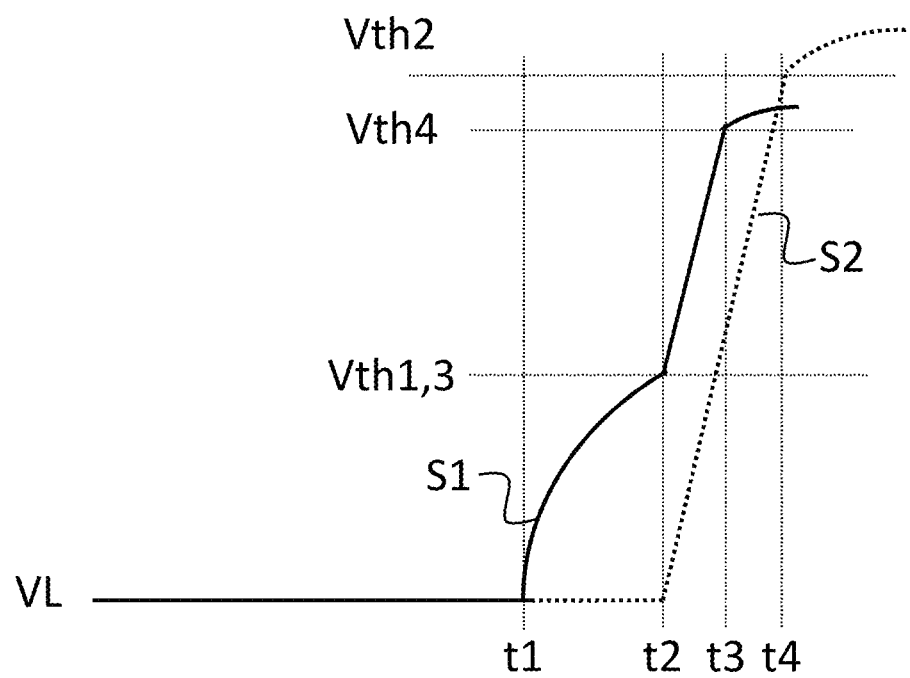
FIG. 3 is a signal diagram illustrating an operation of an A-side accelerator element and a B-side accelerator element according to an embodiment of the present disclosure.

An operation of first and second accelerator element 3a, 3b is described next, with reference to FIG. 3. In FIG. 3, a first voltage signal S1 and a second voltage signal S2 are shown over time. For example, first signal S1 corresponds to a voltage level at A-side terminal 2a, and second signal S2 corresponds to a voltage level at B-side terminal 2b. In this example, repeating unit 1 is operating in the first mode.

For convenience, the logic 'high' voltage level at each of A-side and B-side terminal 2a, 2b is assumed to be equal to VH, and the logic 'low' voltage level at each of A-side and B-side terminal 2a, 2b is assumed to be equal to VL. In particular, in the example shown in FIG. 3, A-side supply voltage Va is equal to B-side supply voltage Vb.

Prior to a first time instance t1, the first communication unit previously pulled down the voltage on the first bus line, resulting in a VL level at A-side terminal 2a. This voltage signal is repeated by repeating unit 1 at B-side terminal 2b. As a result, prior to time instance t1, both signals S1, S2 are at VL.

At first time instance t1, the first communication unit stops pulling down the voltage on the first bus line. As a result, the voltage on the first bus line, and thus also the voltage at A-side terminal 2a, is pulled up from VL by the pull-up resistance in an exponentially rising manner, in dependence of the corresponding time constant formed by the pull-up resistance and the bus line capacitance.

At a second time instance t2, the voltage at A-side terminal 2a surpasses a first threshold voltage Vth1. Based thereon, first control unit 11a determines that a rising edge is occurring at A-side terminal 2a, and controls B-side accelerator element 3b to pull up the voltage at B-side terminal 2b. Assuming a substantially constant current from B-side accelerator element 3b, voltage signal S2 may increase substantially linearly while B-side accelerator element 3b is actively pulling up the voltage at B-side terminal 2b. In addition, the current from B-side accelerator element 3b may substantially exceed the current through the pull-up resistor connected to B-side terminal 2b, such that the rise time of voltage signal S2 is greatly reduced.

At time instance t4, the voltage at B-side terminal 2b surpasses a second threshold voltage Vth2. Based thereon, second control unit 11b controls B-side accelerator element 3b to stop pulling up the voltage at B-side terminal 2b. Consequently, after time instance t4, the voltage at B-side terminal 2b is only pulled up by the corresponding pull-up resistor, and the bus line capacitance is further charged to Vb in an exponentially rising manner.

By using B-side accelerator element 3b during at least a portion of the transition from VL to VH at B-side terminal 2b, a rise time at B-side terminal 2b is significantly reduced, and the maximum reliable communication rate between the first and second communication unit is increased.

In practice, B-side accelerator element 3b is not an ideal voltage-controlled current source. Instead, its current may depend, at least in part, on the voltage at B-side terminal 2b. For example, if B-side accelerator element 3b is a PMOS transistor, then a substantially constant current is generated only while said transistor is operating in its saturation region. However, when the voltage at B-side terminal 2b increases, the transistor may enter its linear operation region, resulting in a decrease in current through the transistor.

Furthermore, it may not be necessary for the voltage at B-side terminal 2b to be charged fully to Vb. For example, the second communication unit may be able to determine that a logic 'high' signal is sent by the first communication unit when the voltage on the second bus line exceeds a fraction of Vb, such as 80% of Vb.

Therefore, to reduce the power consumption of repeating unit 1 and to efficiently and effectively charge the second bus line capacitance, B-side accelerator element 3b is disabled at second threshold voltage Vth2, which may be only a fraction of the Vb level. For example, second threshold voltage Vth2 may correspond to 80% of Vb.

In addition to the above, when repeating unit 1 is operating in the first mode, the voltage at A-side terminal 2a may also be accelerated. For example, second control unit 11b may control A-side accelerator element 3a to pull up the voltage at A-side terminal 2a at time instance t2, when the voltage at A-side terminal 2a surpasses first threshold voltage Vth1. Consequently, A-side accelerator element 3a may be activated substantially at the same time as B-side accelerator element 3b. However, this need not be the case. A-side accelerator element 3a may be enabled at a different time instance. For example, A-side accelerator element 3a may be enabled when the voltage at A-side terminal 2a exceeds a third threshold voltage.

Similarly, second control unit 11b controls A-side accelerator element 3a to stop pulling up the voltage at A-side terminal 2a at a time instance t3 when the voltage at A-side terminal 2a surpasses second threshold voltage Vth2, or when it surpasses a fourth threshold voltage different form second threshold voltage Vth2.

The signal diagram shown in FIG. 3 may similarly apply when repeating unit 1 is operating in the second mode. In that case, referring to FIG. 3, first signal S1 may instead correspond to a voltage signal at B-side terminal 2b, and second signal S2 may correspond to a voltage signal at A-side terminal 2a. Furthermore, identical or different threshold voltages may be selected for activating A-side accelerator element 3a and B-side accelerator element 3b depending on the operating mode of repeating unit 1.

In some cases, it may be required for repeating unit 1 to determine whether an external pull-down event by the second communication unit occurs, even though repeating unit 1 is operating in the first mode. Similarly, an external pull-down event by the first communication unit may occur, even though repeating unit 1 is operating in the second mode.

For example, while the first communication unit transfers data to the second communication unit, repeating unit 1 is operating in the first mode. However, during this data transfer, the second communication unit may be required to transmit an acknowledgment, 'ACK', to the first communication unit to confirm that a particular amount of data is received by the second communication unit.

In another example, such as for I2C communication, the first communication unit may provide a clock signal to the second communication unit via repeating unit 1, in order for the second communication unit to synchronize a data signal received via another bus line to the received clock signal. However, it may occur that the second communication unit requires more time to process the received data before proceeding, and may indicate so through a pull-down event on the clock bus line to which it is connected. In the I2C protocol, this specific pull-down event is referred to as 'clock stretching'.

In both examples given above, information needs to be provided from the second communication unit to the first communication unit, even though repeating unit 1 is operating in the first mode. Thus, there is a need for detecting external pull-down events, and for switching the operating mode of repeating unit 1 accordingly to be able to transfer the required information in the opposite communication direction. In particular, different scenarios can be distinguished in which external pull-down events may have to be detected.

In a first scenario, the second communication unit performs a pull-down event while the voltage at B-side terminal 2b is already at VH (or VHb). In that case, A-side direction determination element 7a and/or B-side direction determination element 7b is able to detect said pull-down as described above.

Figure 5:
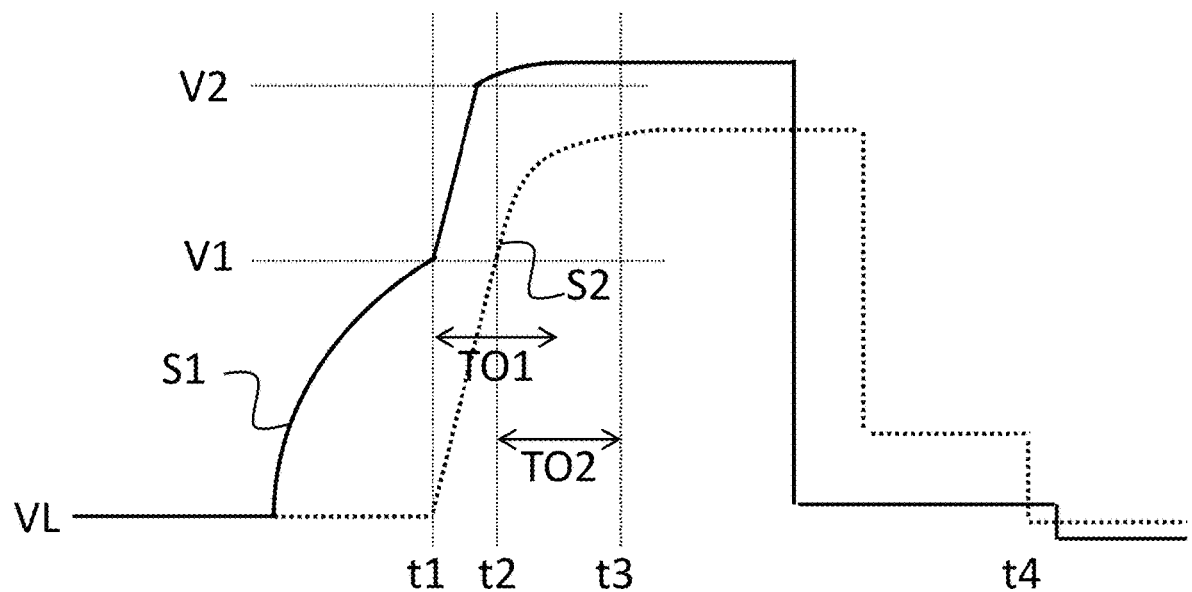
FIG. 5 is a signal diagram illustrating an operation of a first and/or second pull-down detection unit according to an embodiment of the present disclosure.

In a second scenario, the second communication unit performs a pull-down event while the voltage at B-side terminal 2b is at VL (or VLb). In other words, B-side pull-down element 6b is pulling down the voltage at B-side terminal 2b. Due to the additional pull-down from the second communication unit, the voltage at B-side terminal 2b the pull-down strength at B-side terminal 2b is effectively increased, resulting in a decrease of the voltage at B-side terminal 2b to a value below VL (or VLb). This second scenario is illustrated in FIG. 5, where it occurs at time instance t4.

In order to detect an external pull-down event in the second scenario, repeating unit 1 may comprise a B-side pull-down detection unit comprised in B-side pull-down control unit 5b. The first pull-down detection unit is configured to determine whether the voltage at B-side terminal 2b is below VL and outputs a signal indicative of external pull-down. Based on detecting the external pull-down event by the first pull-down detection unit, the operating mode of repeating unit 1 can be switched, and A-side pull-down control unit 5a and B-side pull-down control unit 5b can be controlled accordingly. Similarly, repeating unit 1 may comprise a A-side pull-down detection unit comprised in A-side pull-down control unit 5a for detecting an external pull-down event caused by the first communication unit while repeating unit 1 is operating in the second mode and while A-side pull-down element 6a is actively pulling down the voltage at A-side terminal 2a. An operation of A-side pull-down control unit 5a and B-side pull-down control unit 5b is described in more detail with reference to FIG. 4.

In a third scenario, the second communication unit performs a pull-down event while the voltage at B-side terminal 2b is transitioning from VL (or VLb) to VH (or VLh). In particular, the pull-down event may occur while B-side accelerator element 3b is active. In that case, the pull-down event by the second communication unit is opposed by the pull-up from B-side accelerator element 3b and any pull-up resistor(s) connected to the second bus line.

In order to detect an external pull-down event during a low to high transition at B-side terminal 2b, repeating unit 1 may comprise a second pull-down detection unit 12b. Similarly, in order to detect an external pull-down event during a low to high transition at A-side terminal 2a, repeating unit 1 may comprise a first pull-down detection unit 12a. A detailed operation of the first and second pull-down detection unit 12a, 12b is described further below, with reference to FIG. 5.

Figure 4:
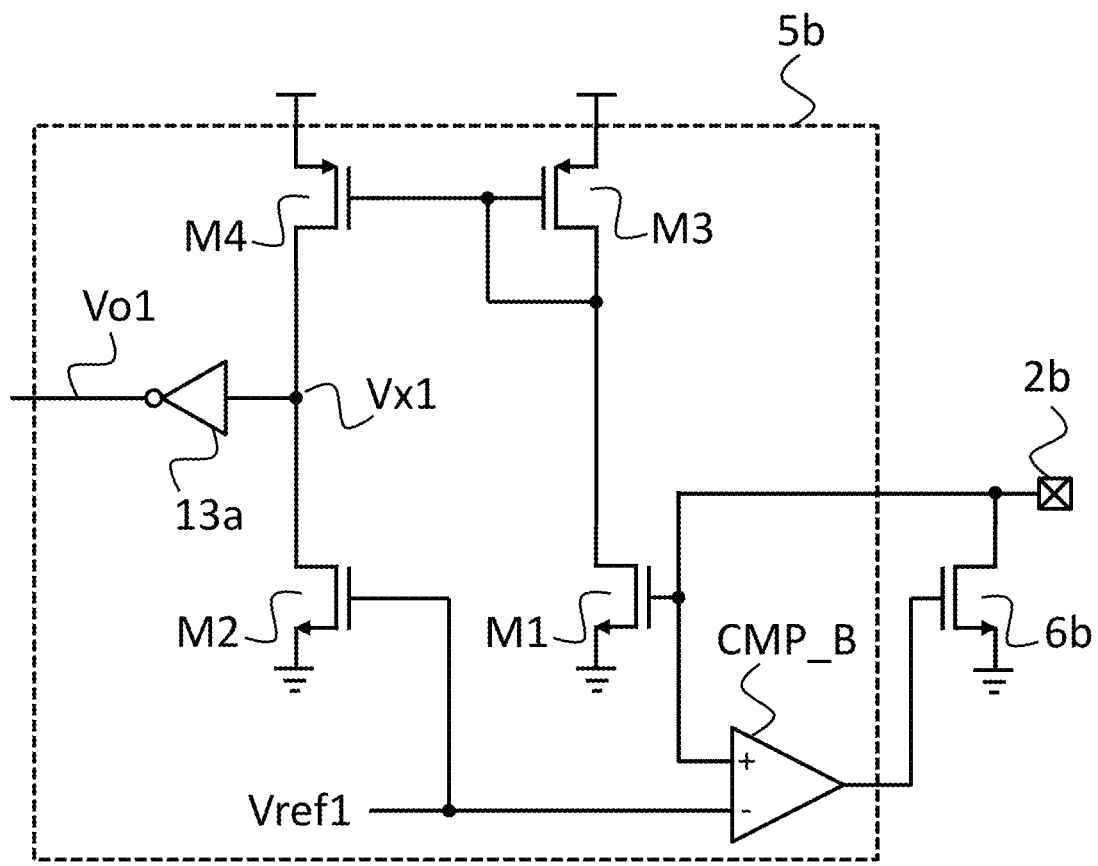
FIG. 4 is a circuit diagram of a B-side pull-down detection unit and a B-side pull-down element according to an embodiment of the present disclosure.

In FIG. 4 a portion of repeating unit 1 is shown comprising B-side pull-down control unit 5b, B-side pull-down element 6b (an NMOS transistor), and B-side terminal 2b. In particular, B-side pull-down control unit 5b comprises a B-side comparing unit CMP_B having a first reference voltage Vref1 and the voltage at B-side terminal 2b as its input. An output of B-side comparing unit CMP_B is configured to provide the first control signal, and is electrically connected to a gate terminal of B-side pull-down element 6b.

B-side comparing unit CMP_B is configured to be disabled when repeating unit 1 is operating in the second mode. For example, B-side comparing unit CMP_B is disabled by B-side direction detection element 7b upon determining that repeating unit 1 is operating in the second mode.

Furthermore, B-side comparing unit CMP_B is configured to be disabled when a logic 'high' voltage signal is to be provided at B-side terminal 2*b* by repeating unit 1. For example, B-side direction determination element 7*b* is configured to disable B-side comparing unit CMP_B based on the first buffered signal, or the signal received from A-to-B level shifter 8*a*, being indicative of a logic 'high' voltage signal at A-side terminal 2*a*.

On the other hand, when a logic 'low' voltage signal is to be provided at B-side terminal 2*b* by repeating unit 1, B-side comparing unit CMP_B is enabled. When B-side comparing unit CMP_B is enabled, the voltage at B-side terminal 2*b* is regulated to first reference voltage Vref1 through a negative feedback loop formed by B-side comparing unit CMP_B and B-side pull-down element 6*b*. In other words, B-side comparing unit CMP_B controls the gate voltage of B-side pull-down element 6*b* such that the voltage at B-side terminal 2*b* is substantially equal to first reference voltage Vref1.

In accordance with the second scenario described above, the second communication unit may perform an external pull-down of the voltage on the second bus line, and thus also the voltage at B-side terminal 2*b*, while B-side comparing unit CMP_B and B-side pull-down element 6*b* are enabled. However, in practice, the negative feedback loop formed by B-side comparing unit CMP_B and B-side pull-down element 6*b* will not be able to respond instantaneously to an external pull-down of the voltage at B-side terminal 2*b*. As a result, the voltage at B-side terminal 2*b* temporarily decreases below first reference voltage Vref1.

The B-side pull-down detection unit comprises a first detection unit transistor M1, a second detection unit transistor M2, and a first current mirror formed by transistors M3 and M4, wherein transistor M3 forms an input branch of the first current mirror, and wherein transistor M4 forms an output branch of the first current mirror. Transistors M3, M4 may both be PMOS transistors. First detection unit transistor M1 may comprise an NMOS transistor having a drain terminal thereof connected to the input branch of the first current mirror, and having a gate terminal thereof connected to B-side terminal 2*b*. Second detection unit transistor M2 may comprise an NMOS transistor. A drain terminal of second detection unit transistor M2 and the output branch of the first current mirror are electrically connected to a first node Vx1, and a gate terminal of second detection unit transistor M2 is connected to first reference voltage Vref1. Transistor M4 is effectively scaled with respect to transistor M3 by a ratio a:1, such that a current through transistor M4 is a times a current through transistor M3 when both transistors M3, M4 have a same drain-source voltage. The B-side pull-down detection unit further comprises a first invertor 13*a* arranged in between first node Vx1 and an output of the B-side pull-down detection unit. The output of the B-side pull-down detection unit is indicative of external pull-down by the second communication unit at B-side terminal 2*b*.

The scaling ratio between transistors M3, M4 can be realized in various ways, as will be appreciated by a person skilled in the art. For example, transistor M4 may be formed using a different number of gate fingers than transistor M3. Alternatively, transistors M3, M4 may each be formed using a plurality of parallel-connected unit transistors, and the number of parallel-connected unit transistors forming transistor M4 may be different from the number of parallel-connected unit transistors forming transistor M3. Furthermore, the scaling ratio may be selectable through a digital or physical switch configured to the number of parallel-connected unit transistors forming transistor M3 and/or the number of parallel-connected unit transistors forming transistor M4.

When B-side comparing unit CMP_B is enabled, and in absence of external pull-down, a gate voltage of first detection unit transistor M1 and a gate voltage of second detection unit transistor M2 are each substantially equal to first reference voltage Vref1. As a result, first and second detection unit transistor M1, M2 will sink substantially the same current. The current generated by first detection unit transistor M1 flows through transistor M3 and is mirrored to transistor M4. However, since transistor M4 is scaled with respect to transistor M3, a current through transistor M4 will initially exceed the current through second detection unit transistor M2. As a result, a voltage at first node Vx1 will increase, forcing the current through transistor M4 to decrease with respect to the current through second detection unit transistor M2 until both currents are in a balanced condition. As a result, in absence of external pull-down, the voltage at first node Vx1 will be high, and a voltage outputted by the A-side pull-down detection unit will be low due to the inverting operation of first invertor 13*a*.

However, when an external pull-down event occurs, the current through first detection unit transistor M1, and thus also the current through transistors M3 and M4, will temporarily decrease, because the gate voltage of first detection unit transistor M1 decreases. However, the gate voltage of second detection unit transistor M2 remains unchanged and equal to first reference voltage Vref1. As a result, the voltage at first node Vx1 must decrease in order to restore the balanced condition of the current through second detection unit transistor M2 and the current through transistor M4. If the voltage at B-side terminal 2*b* decreases by a sufficient amount, then the change in current through transistor M4 may be sufficiently large such that the voltage at output Vo1 becomes high, said high voltage being indicative of an external pull-down event. Based on the voltage at output Vo1, repeating unit 1 can be controlled accordingly. For example, upon detecting external pull-down in the first mode, the operating mode can be switched from the first mode to the second mode such that repeating unit 1 can repeat the signal provided by the second communication unit at A-side terminal 2*a*.

A-side pull-down control unit 5*a* and its operation in combination with A-side pull-down element may be substantially similar to B-side pull-down control unit 5*b* and B-side pull-down element 6*b* as shown in FIG. 4. A detailed description thereof is therefore omitted.

Next, an operation of first pull-down detection unit 12*a* and second pull-down detection unit 12*b* is described with reference to FIG. 5. In FIG. 5, a first voltage signal S1 and a second voltage signal S2 are shown over time. First voltage signal S1 may correspond to the voltage at one of A-side and B-side terminal 2*a*, 2*b*, and second voltage signal S2 may correspond to the voltage at the other of A-side and B-side terminal 2*a*, 2*b*, depending on the operating mode of repeating unit 1. For example, when repeating unit 1 operates in the first mode, first voltage signal S1 may correspond to the voltage at A-side terminal 2*a*, and second voltage signal S2 may correspond to a voltage at B-side terminal 2*b*.

In accordance with the third scenario described above, external pull-down may have to be detected by repeating unit 1 during a transition from VL to VH at one of its terminals 2*a*, 2*b*. For example, the second communication unit may pull down the voltage on the second bus line, and thus also the voltage at B-side terminal 2*b*, while B-side accelerator element 3*b* is actively pulling up said voltage. In that case, the pull-down by the second communication unit is opposed by the pull-up of B-side accelerator element 3b.

First pull-down detection unit 12a is configured to, based on one or more pre-defined parameters of an expected low to high transition at B-side terminal 2b and one or more corresponding parameters of the voltage at B-side terminal 2b, determine whether external pull-down is occurring. For example, an expected low to high transition curve can be compared to the actual voltage during a low to high transition at B-side terminal 2b. First pull-down detection unit 12a may then be configured to determine that there is external pull-down based on a difference between the expected transition curve and the determined transition curve.

In FIG. 5, a timer-based approach is illustrated. In particular, the one or more pre-defined parameters may include an expected voltage rise within a predetermined time interval. For example, upon activating B-side accelerator element 3b based on the voltage at A-side terminal 2a as described above (i.e., at time instance t1), a first timer is initiated by first pull-down detection unit 12a. If the first timer reaches a first time-out value TO1 before the voltage at B-side terminal 2b reaches a first pre-defined voltage level V1, then first pull-down detection unit 12a determines that external pull-down is occurring. However, it is noted that the present disclosure is not limited to initiating a timer at time instance t1. The timer may instead be initiated some time after time instance t1, for example based on a voltage at B-side terminal 2b. Furthermore, although first pre-defined voltage level V1 corresponds to a voltage of first voltage signal S1 at which B-side accelerator element 3a is activated, this also need not be the case.

In FIG. 5, second voltage signal S2 reaches first pre-defined voltage level V1 at time instance t2, before the indicated first time-out value TO1 is reached. As a next step, for example immediately at time instance t2, first pull-down control unit 12a may initiate a second timer, or may restart the first timer. Similarly, if a second time-out value TO2 is reached before the voltage at B-side terminal 2b reaches a second predefined voltage level V2, then first pull-down detection unit 12a determines that there is external pull-down.

Upon detecting an external pull-down event at B-side terminal 2b, first pull-down control unit 12a may be configured to change an operating mode of repeating unit 1 from the first mode to the second mode, such that the pull-down at B-side terminal 2b can be communicated to the first communication unit through repeating unit 1.

Second pull-down detection unit 12b may be substantially identical to first pull-down detection unit 12a, and may be configured to detect whether external pull-down by the first communication unit occurs at A-side terminal 2a in a substantially similar manner.

Referring to FIG. 2, each of first control unit 11a, second control unit 11b, first pulldown detection unit 12a and second pull-down detection unit 12b may be comprised in a controller 10 of repeating unit 1. For convenience, connections between elements of controller 10 and various components of repeating unit 1 are omitted from FIG. 2.

Figure 6:
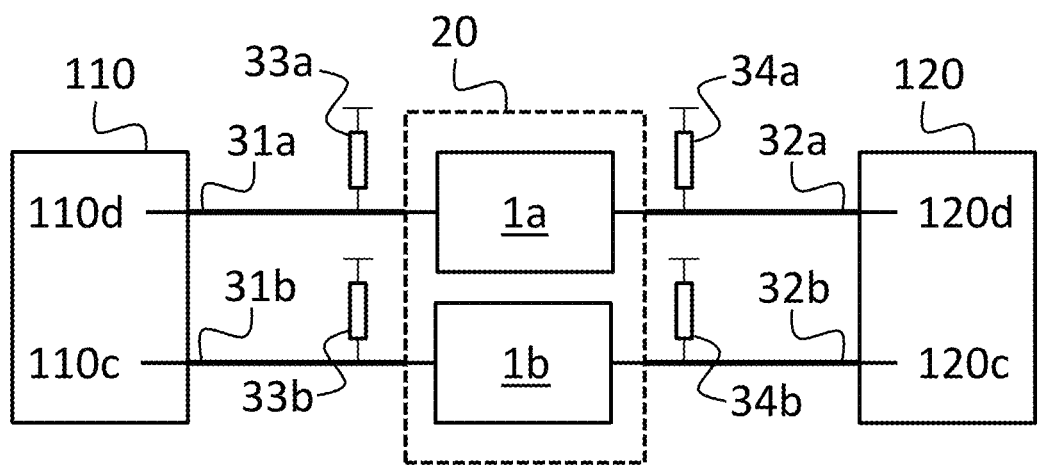
FIG. 6 is a schematic diagram of a system employing I2C bus communication according to an embodiment of the present disclosure.

FIG. 6 shows a system 30 employing repeater 20 according to the present disclosure. In particular, system 30 comprises a first communication unit 110, a second communication unit 120, and repeater 20. Repeater 20 comprises a first repeating unit 1a and a second repeating unit 1b. Each of first and second repeating unit 1a, 1b may correspond to an embodiment of repeating unit 1, for example the embodiment shown in FIG. 2.

A-side terminal 2a of first repeating unit 1a is connected to a data pin 110d of first communication unit 110 via a respective first bus line 31a, and B-side terminal 2b of first repeating unit 1a is connected to a data pin 120d of second communication unit 120 via a respective second bus line 32a. Similarly, A-side terminal 2a of second repeating unit 1b is connected to a clock pin 110c of first communication unit 110 via a respective first bus line 31b, and B-side terminal 2b of second repeating unit 1b is connected to a clock pin 120c of second communication unit 120 via a respective second bus line 32b. In system 30, communication between first and second communication unit 110, 120 may be performed based on the I2C protocol.

System 30 comprises first pull-up resistors 33a, 33b connected to a respective first bus lines 31a, 31b, and second pull-up resistors 34a, 34b connected to second bus lines, 32a, 32b, respectively. However, the present disclosure is not limited thereto. In particular, first repeating unit 1a and/or second repeating unit 1b may comprise an internal A-side pull-up resistor 9a and/or B-side pull-up resistor 9b, as shown in FIG. 2. It is also envisaged that pull-up resistors are included both internally and externally to repeater 20.

In the above, the present disclosure has been explained using detailed embodiments thereof. However, it should be appreciated that the disclosure is not limited to these embodiments and that various modifications are possible without deviating from the scope of the present disclosure as defined by the appended claims.

What is claimed is:

1. A bus repeater for open-drain bus communication comprising a repeating unit, the repeating unit having an A-side terminal configured to be electrically connected to an A-side open-drain bus line, and a B-side terminal configured to be electrically connected to a B-side open-drain bus line;
   wherein the repeating unit is operable in a first mode in which the repeating unit is configured to receive a signal at the A-side terminal and to produce a signal at the B-side terminal based on the signal received at the A-side terminal;
   wherein the repeating unit comprises a B-side accelerator element electrically connected to the B-side terminal;
   wherein the repeating unit further comprises a first control unit configured to, control the B-side accelerator element to pull up a voltage at the B-side terminal when the repeating unit is operating in the first mode, and when the voltage at the A-side terminal surpasses a first threshold voltage during a rising edge of the voltage, and to subsequently control the B-side accelerator element to stop pulling up the voltage at the B-side terminal when the voltage at the B-side terminal surpasses a second threshold voltage.

2. The bus repeater according to claim 1, wherein the B-side accelerator element comprises a B-side accelerator transistor that is arranged in between a B-side supply voltage terminal and the B-side terminal and has a control terminal; wherein the first control unit is configured to control a voltage at a control terminal of the B-side accelerator transistor to control the B-side accelerator transistor; and wherein the B-side accelerator transistor comprises a p-type metal-oxide-semiconductor, 'MOS' transistor.

3. The bus repeater according to claim 2, wherein the repeating unit further comprises:
   an A-to-B buffer configured to receive the signal at the A-side terminal and to produce a first buffered signal;
   a B-side pull-down control unit configured to receive the first buffered signal from the A-to-B buffer and to produce a first control signal based on the received first buffered signal, the B-side pull-down control unit being configured to be activated in response to a high to low voltage transition at the A-side terminal when the repeating unit is operating in the first mode;
a B-side pull-down element configured to pull down the voltage at the B-side terminal based on the first control signal;
wherein the B-side pull-down element comprises a B-side pull-down transistor that is arranged in between the B-side terminal and a B-side ground reference terminal and that has a control terminal;
wherein the first control signal controls a voltage at the control terminal of the B-side pull-down transistor to control the B-side pull-down transistor; and
wherein the B-side pull-down transistor comprises an n-type metal oxide semiconductor, NMOS transistor.

4. The bus repeater according to claim 3, wherein the repeating unit is operable in a second mode in which the repeating unit is configured to receive a signal at the B-side terminal and to produce a signal at the A-side terminal based on the signal received at the B-side terminal;
wherein the second control unit is configured to control the A-side accelerator element to pull up a voltage at the A-side terminal when the repeating unit is operating in the second mode, and when the voltage at the B-side terminal surpasses a fifth threshold voltage during a rising edge of the voltage, and to subsequently control the A-side accelerator element to stop pulling up the voltage at the A-side terminal when the voltage at the A-side terminal surpasses a sixth threshold voltage;
wherein the repeating unit further comprises:
a B-to-A buffer configured to receive the signal at the B-side terminal and to produce a second buffered signal;
an A-side pull-down control unit configured to receive the second buffered signal from the B-to-A buffer and to produce a second control signal based on the received second buffered signal, the A-side pull-down control unit being configured to be activated in response to a high to low voltage transition at the B-side terminal when the repeating unit is operating in the second mode; and
an A-side pull-down element configured to pull down the voltage at the A-side terminal based on the second control signal,
wherein the A-side pull-down element comprises an A-side pull-down transistor that is arranged in between the A-side terminal and an A-side ground reference terminal and that has a control terminal; wherein the second control signal controls a voltage at the control terminal of the A-side pull-down transistor to control the A-side pull-down transistor; and wherein the A-side pull-down transistor comprises an NMOS transistor.

5. The bus repeater according to claim 4, wherein, when the repeating unit is operating in the second mode, the first control unit is configured to control the B-side accelerator element to pull up the voltage at the B-side terminal when the voltage at the B-side terminal surpasses a seventh threshold voltage, and to subsequently control the B-side accelerator element to stop pulling up the voltage at the B-side terminal when the voltage at the B-side terminal surpasses an eighth threshold voltage, the eighth threshold voltage being greater than the seventh threshold voltage, wherein:
the fifth and/or seventh threshold voltage is equal to the first threshold voltage; and/or
the sixth and/or eighth threshold voltage is equal to the second threshold voltage; and/or
the sixth threshold voltage is greater than the fifth threshold voltage.

6. The bus repeater according to claim 5, wherein the repeating unit further comprises a direction determination unit configured to:
determine whether the repeating unit is operating in the first mode or the second mode; and
control the A-side pull-down control unit and/or the B-side pull-down control unit based on the determined mode;
wherein the direction determination unit comprises:
an A-side direction determination element arranged in between the B-to-A buffer and the A-side pull-down control unit; and
a B-side direction determination element arranged in between the A-to-B buffer and the B-side pull-down control unit;
wherein the A-side direction determination element is configured to determine, based on the first buffered signal and the second buffered signal, whether the repeating unit is operating in the first mode, and to control the A-side pull-down control unit based on whether the repeating unit is operating in the first mode; and
wherein the B-side direction determination element is configured to determine, based on the first buffered signal and the second buffered signal, whether the repeating unit is operating in the second mode, and to control the B-side pull-down control unit based on whether the repeating unit is operating in the second mode.

7. The bus repeater according to claim 6, wherein the A-side direction determination element is configured to determine that the repeating unit is operating in the first mode when a high to low voltage transition of the first buffered signal occurs before a high to low transition of the second buffered signal; and
wherein the B-side direction determination element is configured to determine that the repeating unit is operating in the second mode when a high to low voltage transition of the second buffered signal occurs before a high to low transition of the first buffered signal.

8. The bus repeater according to claim 6, wherein the repeating unit further comprises:
a first pull-down detection unit configured to determine whether an external device is pulling down the voltage at the A-side terminal during a low to high voltage transition at the A-side terminal; and/or
a second pull-down detection unit configured to determine whether an external device is pulling down the voltage at the B-side terminal during a low to high voltage transition at the B-side terminal;
wherein the first pull-down detection unit and the second pull-down detection unit are configured to:
compare one or more parameters of the low to high voltage transition at the A-side terminal or the B-side terminal, respectively, to corresponding one or more pre-defined parameters; and
output a signal indicative of external pull-down based on the comparison;
wherein the one or more parameters represent at least one of:
a voltage difference between the voltage at a respective terminal among the A-side and B-side terminal at a start and at an end of a predetermined time interval;

a voltage at a predetermined time after the voltage at a respective terminal among the A-side and B-side terminal starts being pulled up by a corresponding accelerator element; and a plurality of voltages at a respective terminal among the A-side and B-side terminal at different time instances.

9. The bus repeater according to claim 8, wherein the first pull-down detection unit and/or the second pull-down detection unit is configured to:

initiate a first timer when the voltage at a respective terminal among the A-side or B-side terminal starts to be pulled up by the corresponding accelerator element; and output a signal indicative of external pull-down if the first timer exceeds a first time-out value before the voltage at the respective terminal reaches a first pre-defined voltage level;

wherein the first pull-down detection unit and/or the second pull-down detection unit is further configured to, if the first timer does not exceed the first time-out value before the voltage at the respective terminal reaches the first pre-defined voltage level:

initiate a second timer when the voltage at the respective terminal surpasses the first pre-defined voltage level; and output a signal indicative of external pull-down if the second timer exceeds a second time-out value before the voltage at the respective terminal reaches a second pre-defined voltage level; and wherein the first timer and the second timer are identical or wherein the second timer is formed by the first timer.

10. The bus repeater according to claim 4, wherein the repeating unit further comprises a direction determination unit configured to:

determine whether the repeating unit is operating in the first mode or the second mode, and control the A-side pull-down control unit and/or the B-side pull-down control unit based on the determined mode, wherein the direction determination unit comprises:
an A-side direction determination element arranged in between the B-to-A buffer and the A-side pull-down control unit; and
a B-side direction determination element arranged in between the A-to-B buffer and the B-side pull-down control unit, wherein the A-side direction determination element is configured to determine, based on the first buffered signal and the second buffered signal, whether the repeating unit is operating in the first mode, and to control the A-side pull-down control unit based on whether the repeating unit is operating in the first mode; and wherein the B-side direction determination element is configured to determine, based on the first buffered signal and the second buffered signal, whether the repeating unit is operating in the second mode, and to control the B-side pull-down control unit based on whether the repeating unit is operating in the second mode.

11. The bus repeater according to claim 1, wherein the repeating unit further comprises:

an A-to-B buffer configured to receive the signal at the A-side terminal and to produce a first buffered signal;

a B-side pull-down control unit configured to receive the first buffered signal from the A-to-B buffer and to produce a first control signal based on the received first buffered signal, the B-side pull-down control unit being configured to be activated in response to a high to low voltage transition at the A-side terminal when the repeating unit is operating in the first mode;

a B-side pull-down element configured to pull down the voltage at the B-side terminal based on the first control signal;

wherein the B-side pull-down element comprises a B-side pull-down transistor that is arranged in between the B-side terminal and a B-side ground reference terminal and that has a control terminal;

wherein the first control signal controls a voltage at the control terminal of the B-side pull-down transistor to control the B-side pull-down transistor; and wherein the B-side pull-down transistor comprises an n-type metal oxide semiconductor, NMOS, transistor.

12. The bus repeater according to claim 1, wherein the repeating unit further comprises:

an A-side accelerator element electrically connected to the A-side terminal; and a second control unit;

wherein the second control unit is configured to control the A-side accelerator element to pull up the voltage at the A-side terminal when the repeating unit is operating in the first mode, and when the voltage at the A-side terminal surpasses a third threshold voltage during a rising edge of the voltage, and to subsequently control the A-side accelerator element to stop pulling up the voltage at the A-side terminal when the voltage at the A-side terminal surpasses a fourth threshold voltage, the fourth threshold voltage being greater than the third threshold voltage;

wherein the A-side accelerator element comprises an A-side accelerator transistor that is arranged in between an A-side supply voltage terminal and the A-side terminal and that has a control terminal;

wherein the second control unit is configured to control a voltage at the control terminal of the A-side accelerator transistor to control the A-side accelerator transistor; and wherein the A-side accelerator transistor comprises a PMOS transistor.

13. The bus repeater according to claim 12, wherein the first threshold voltage is equal to the third threshold voltage, and/or wherein the second threshold voltage is equal to the fourth threshold voltage; and/or wherein the second control unit is identical to the first control unit; or wherein the second control unit is formed by the first control unit.

14. The bus repeater according to claim 13, wherein the repeating unit is operable in a second mode in which the repeating unit is configured to receive a signal at the B-side terminal and to produce a signal at the A-side terminal based on the signal received at the B-side terminal;

wherein the second control unit is configured to control the A-side accelerator element to pull up a voltage at the A-side terminal when the repeating unit is operating in the second mode, and when the voltage at the B-side terminal surpasses a fifth threshold voltage during a rising edge of the voltage, and to subsequently control the A-side accelerator element to stop pulling up the voltage at the A-side terminal when the voltage at the A-side terminal surpasses a sixth threshold voltage;

wherein the repeating unit further comprises:
a B-to-A buffer configured to receive the signal at the B-side terminal and to produce a second buffered signal;

an A-side pull-down control unit configured to receive the second buffered signal from the B-to-A buffer and to produce a second control signal based on the received second buffered signal, the A-side pull-down control unit being configured to be activated in response to a high to low voltage transition at the B-side terminal when the repeating unit is operating in the second mode; and an A-side pull-down element configured to pull down the voltage at the A-side terminal based on the second control signal, wherein the A-side pull-down element comprises an A-side pull-down transistor that is arranged in between the A-side terminal and an A-side ground reference terminal and that has a control terminal, wherein the second control signal controls a voltage at the control terminal of the A-side pull-down transistor to control the A-side pull-down transistor, and wherein the A-side pull-down transistor comprises an NMOS transistor.

15. The bus repeater according to claim 1, wherein the repeating unit further comprises:
an A-side pull-up resistor, a terminal thereof being electrically connected to the A-side terminal and another terminal thereof to an A-side supply voltage terminal;
and/or a B-side pull-up resistor, a terminal thereof being electrically connected to the B-side terminal, and another terminal thereof to a B-side supply voltage terminal;
wherein an A-side supply voltage received at the A-side supply voltage terminal during operation is substantially identical to a B-side supply voltage received at the B-side supply voltage terminal during operation; or
wherein the A-side supply voltage differs from the B-side supply voltage;
wherein the repeating unit further comprises:
an A-to-B level shifter arranged in between the A-to-B buffer and the B-side direction determination element, the A-to-B level shifter being configured to generate a signal at an output thereof based on the first buffered signal, the outputted signal having a different voltage range with respect to the first buffered signal; and
a B-to-A level shifter arranged in between the B-to-A buffer and the A-side direction determination element, the B-to-A level shifter being configured to generate a signal at an output thereof based on the second buffered signal, the outputted signal having a different voltage range with respect to the second buffered signal;
wherein the voltage range of the signal generated by the A-to-B level shifter is equal to the voltage range of the second buffered signal, and wherein the voltage range of the signal generated by the B-to-A level shifter is equal to the voltage range of the first buffered signal.

16. The bus repeater according to claim 1, wherein the bus repeater is an inter-integrated circuit, (I2C) repeater; and/or the bus repeater comprises a plurality of the repeating units, or both.

17. A system comprising:
one or more first bus lines;
one or more second bus lines;
a first communication unit;
a second communication unit; and
a bus repeater according to claim 16, the A-side terminal of at least one repeating unit thereof being electrically connected to the first communication unit via a respective first bus line, and the B-side terminal of the at least one repeating unit thereof being electrically connected to the second communication unit via a respective second bus line;
wherein the repeating unit is operable in a first mode in which the repeating unit is configured to receive a signal at the A-side terminal and to produce a signal at the B-side terminal based on the signal received at the A-side terminal;
wherein the repeating unit comprises a B-side accelerator element electrically connected to the B-side terminal;
wherein the repeating unit further comprises a first control unit configured to control the B-side accelerator element to pull up a voltage at the B-side terminal when the repeating unit is operating in the first mode, and when the voltage at the A-side terminal surpasses a first threshold voltage during a rising edge of the voltage, and control the B-side accelerator element to stop pulling up the voltage at the B-side terminal when the voltage at the B-side terminal surpasses a second threshold voltage; and
wherein the bus repeater is an inter-integrated circuit (I2C) repeater, or the bus repeater comprises a plurality of the repeating units, or both.

18. The system according to claim 17, wherein the bus repeater is an inter-integrated circuit, (I2C) bus repeater, comprising:
a first repeating unit, the A-side terminal thereof being electrically connected to a data pin of the first communication unit via a respective first bus line, and the B-side terminal thereof being electrically connected to a data pin of the second communication unit via a respective second bus line; and
a second repeating unit, the A-side terminal thereof being electrically connected to a clock pin of the first communication unit via a respective first bus line; and the B-side terminal thereof being electrically connected to a clock pin of the second communication unit via a respective second bus line.

* * * * *